United States Patent
Gordon

(12) 
(10) Patent No.: US 6,437,352 B1
(45) Date of Patent: Aug. 20, 2002

(54) CHARGED PARTICLE BEAM PROJECTION LITHOGRAPHY WITH VARIABLE BEAM SHAPING

(75) Inventor: Michael S. Gordon, Lincolndale, NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/323,011

(22) Filed: Jun. 1, 1999

(51) Int. Cl.$^7$ ................................................ H01J 37/30
(52) U.S. Cl. ................................... 250/492.23; 250/398
(58) Field of Search ........................ 250/398, 492.23, 250/492.2

(56) References Cited

U.S. PATENT DOCUMENTS

| | | | | |
|---|---|---|---|---|
| 4,213,053 A | * | 7/1980 | Pfeiffer | 250/492.23 |
| 4,550,258 A | * | 10/1985 | Omata et al. | 250/492.23 |
| 4,698,509 A | * | 10/1987 | Wells et al. | 250/492.23 |
| 5,051,556 A | * | 9/1991 | Sakamoto et al. | 250/396 ML |
| 5,256,881 A | * | 10/1993 | Yamazaki et al. | 250/492.23 |
| 5,523,580 A | * | 6/1996 | Davis | 250/492.23 |
| 5,973,333 A | * | 10/1999 | Nakasuji et al. | 250/398 |
| 6,005,250 A | * | 12/1999 | Skickel et al. | 250/398 |

* cited by examiner

Primary Examiner—Bruce Anderson
(74) Attorney, Agent, or Firm—Whitham, Curtis & Christofferson, P.C.

(57) ABSTRACT

Flexibility of a charged particle (e.g. electron) beam projection lithography tool is enhanced by filling a shaping aperture with the beam, projecting the image of the shaping aperture to a reticle subfield where the image preferably corresponds in size to a "clear" or "aperture" area in a subfield of the reticle and deflecting the beam across a selected portion thereof to develop a compound image which is projected onto the target (e.g. wafer). Deflection of the shaped beam onto the reticle aperture is preferably performed electrostatically with the center of deflection coincident with the source cross-over of the charged particle beam column to avoid motion of the beam at the contrast aperture which is used, possibly together with a beam tube, to collect particles scattered where the deflected beam overlaps the patterned areas of the reticle adjacent the reticle aperture. Fabrication of new reticles is thus avoided for minor design changes by provision of direct writing for the design changes while preserving a large portion of the benefits of high throughput of charged particle beam projection of reticle patterns to the target.

19 Claims, 4 Drawing Sheets

LITHOGRAPHY STEP

CHARGED PARTICLE BEAM PROJECTION LITHOGRAPHY WITH VARIABLE BEAM SHAPING

BACKGROUND OF THE INVENTION

1. Field of the Invention

The present invention generally relates to charged particle beam projection lithography exposure tools and, more particularly, to projection reticles used therein.

2. Description of the Prior Art

Lithographic processes are utilized in the manufacture of many diverse types of devices, particularly when very small areas must be selectively defined and/or operated upon, as in semiconductor integrated circuit manufacture. At least one lithographic process is invariably required for initial definition of locations and basic dimensions of devices such as transistors and capacitors in integrated circuits.

Lithographic processes currently used for integrated circuit manufacture involve the selective exposure of areas of a resist coated on a surface. In general, depending on whether the resist is of a positive or negative type, subsequent development will selectively remove either the exposed or unexposed areas leaving other areas substantially unaffected. In the past, radiant energy has been the resist exposure medium of choice. However, modern integrated circuit designs require feature sizes smaller than can be resolved using even very short wavelengths of light in the deep ultra-violet range even using sophisticated devices such as phase shift masks, off-axis illumination or optical proximity correction. Exposure of the resist with charged particle beams is required to obtain smaller feature sizes which are becoming increasingly common in current integrated circuit designs. Electron beams are generally preferred for charged particle beam exposures since, among other relative advantages, electrons allow control of the beam with both electric and magnetic means.

So-called probe-forming systems form a well-focussed spot at the target surface for exposure of the resist. "Gaussian beam" systems, as the name implies, use a spot of Gaussian cross-section and either vector-address or raster-scan the beam to directly write the circuit of interest. Alternatively, shaped-beam systems, in particular, variable shaped beam (VSB) systems have higher throughput which is accomplished by parallel pixel exposure. A square shaping aperture is uniformly illuminated and imaged to another aperture, the size of which matches the image of the shaping aperture. The image of the shaping aperture is deflected onto the lower aperture and the compound image is then projected to the target (e.g. wafer). The Gaussian systems project one pixel at a time while the shaped beam systems can expose many pixels in parallel although the number of contiguous pixels concurrently exposed is relatively small.

For example, consider a rectangle of dimensions 0.1×2.0 micrometers. Using a Gaussian beam with a 0.05 micrometer feature size, the rectangle corresponds to forty pixels. A shaped beam system with a maximum spot size of 1.0 micrometer square can expose this rectangle in two exposures.

In general, a single exposure for a shaped-beam system is limited to a few hundred pixels, at most, while the full pattern required for a full integrated circuit may include hundreds of millions of pixels or more. Therefore, the throughput of probe-forming exposure tools, even of the shaped-beam type, is too low to be economically feasible for high density, large scale integrated circuits even though exposures can be made at relatively high rate.

To obtain acceptable levels of throughput, electron beam projection lithography has been recently developed. Projection lithography projects a pattern (which may contain several millions of pixels) within a sub-field on a mask or reticle, containing a fraction of the complete circuit pattern, onto the target. This fraction may be small compared to a full pattern but is large compared to the dimensions of the beam in a probe-forming system. The pattern can be demagnified by the charged particle optics of the tool so that the pattern at the target is much smaller than the subfield pattern formed in the reticle.

The demagnified images of the reticle subfields formed from the beam pattern passing through or being scattered from the reticle in sequential exposures are suitably stitched together at the target or wafer to form the overall circuit pattern of the complete integrated circuit design. Generally, it is desirable that all subfield patterns that will be required for a given integrated circuit design be present on a common reticle. However, in the case of stencil reticles, complementary subfields are used to solve the "doughnut" problem of printing closed features; respective parts of which must be exposed from different patterns since annular patterns cannot be fabricated as a stencil.

The practical requirement of providing all necessary patterns on a reticle, however, presents a problem in that even a very minor change in the design or layout of the integrated circuit requires a new reticle to be made incorporating the change. Reticles must be of extremely high precision and complexity as well as being defect-free and are thus extremely expensive to fabricate. Thus, changes and improvements in existing integrated circuit designs may substantially increase the overall cost of manufacture over the economic lifetime of the design.

Further, the so-called local Coulomb effect (LCE) may be particularly pronounced in electron beam projection lithography tools at large beam currents when exposing reticle subfields that contain both sparse and dense features in the same subfield. Local Coulomb effects are caused by the mutual repulsion of particles having the same charge and are manifested as both localized defocussing and therefore an increase in image blur where the exposure pattern is relatively more or less dense, and distortion of the pattern due to dislocation of the subfield features in regions where the density of the exposure pattern changes. These blurs and distortions may or may not be tolerable in a particular design or portion thereof.

These problems are major obstacles to the successful practice of charged particle beam projection lithography since they present limitations on economic feasibility and fidelity of imaging and generally impose trade-offs therebetween. Further, these problems are particularly intractable since they derive from unavoidable physical effects or force a trade-off between tool costs and tool throughput, which also forms a substantial economic cost component of the manufacturing process.

There is, accordingly, a need to extend the utility of charged particle beam projection lithography and electron beam projection lithography, in particular, by providing for direct writing of variable and controllable image shapes other than those directly defined by a particular reticle. Further, there is a need to provide for avoidance of local Coulomb effects, at least for pattern portions in which distortion and resolution may be particularly critical.

SUMMARY OF THE INVENTION

It is therefore an object of the present invention to provide a charged particle beam projection tool having the capability of beam shaping in a controllable manner.

It is a further object of the invention to provide a charged particle beam tools capable of making exposures which do not exhibit local Coulomb effect.

It is yet another object of the invention to provide a charged particle beam projection lithography tool capable of increased resolution and improved economy of operation.

In order to accomplish these and other objects of the invention, a charged particle beam projection lithography tool is provided comprising a shaping aperture, a patterned reticle having an open area, and an arrangement for imaging the shaping aperture at a portion of the open area of the reticle which includes a deflection arrangement for deflecting the shaped charged particle beam having a deflection center at a location of a source crossover of the charged particle beam projection lithography tool.

In accordance with another aspect of the invention, a method of charged particle beam projection lithography and semiconductor device manufacture is provided including steps of projecting a pattern formed in a patterned area of a reticle to a target, and imaging a shaping aperture onto a portion of an open area of the reticle to produce a compound image at said target.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
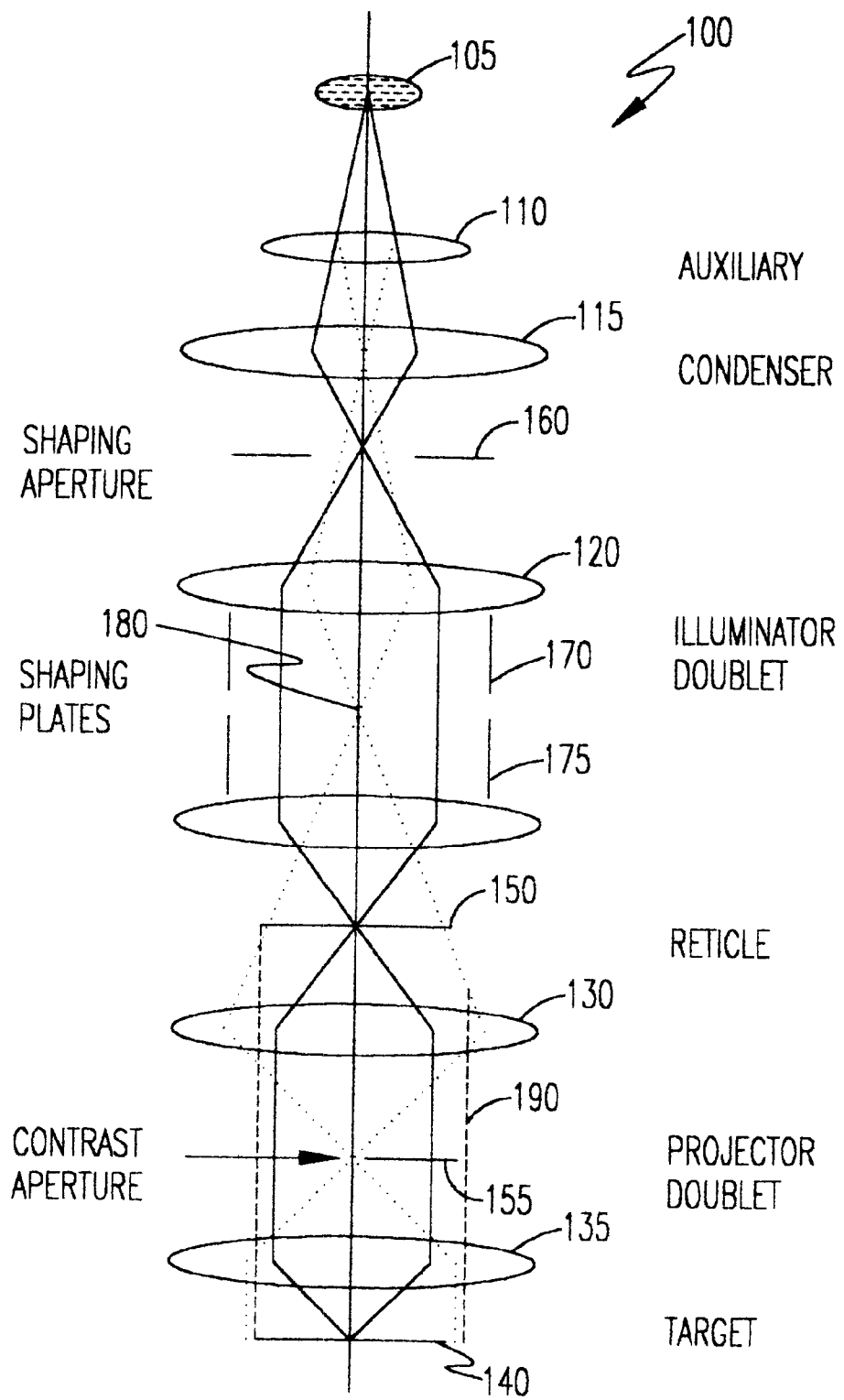
FIG. 1 is a schematic diagram of a charged particle beam column in accordance with a preferred form of the invention.

Referring now to the drawings, and more particularly to FIG. 1, there is shown, in highly schematic form, a charged particle beam column 100 in accordance with the invention. It should be understood that the preferred implementation of the invention employs an electron beam and, while the invention will be explained with reference thereto, the principles of the invention are also fully applicable to beams of ions, as well. Therefore, any reference to electrons and/or electron beams hereinafter should be understood as reflecting the preferred implementation and not as excluding other charged particles or charged particle beams to which the invention may also be applied.

The electron beam column 100 includes an electron (or other charged particle) source 105, a condenser lens arrangement 115, which may include one or more lenses and auxiliary lenses 110 used to position the source cross-over of the beam, an illuminator doublet 120, 125, to provide illumination of a reticle subfield, a projector doublet 130, 135 to demagnify and focus the pattern imposed on the beam by reticle 150 and target 140. It will be recognized by those skilled in the art that these arrangements are generally provided in charged particle beam columns in any of a wide variety of forms of either magnetic or electrostatic types or both and that the details of these elements are not at all critical to the practice of the invention. It will also be recognized by those skilled in the art that the electron beam column will also include various correction elements (e.g. stigmators) and a plurality of deflectors, illustration of which is omitted in the interest of clarity.

In order to obtain the necessary throughput to make projection lithography tools economically viable, the beam must be scanned over a relatively large (e.g. about 10 mm) field at the reticle and a correspondingly smaller field at the wafer. To expose a large area at the wafer, both the reticle 150 and the wafer 140 need to be on translational stages. Furthermore, as is known to those skilled in the art, both stages preferably move in opposite directions, with the reticle stage moving at a velocity greater than the wafer by the same factor as the demagnification of the beam from reticle 150 to wafer 140.

The reticle can be a stencil type, a scattering type or a combination of the two. In all cases, the subfields are patterned with portions of the circuit patterns to be exposed on the electron-beam sensitive resist contained on the wafers at the target plane 140. The subfields that are projected to the target are then appropriately stitched together.

In the stencil type of reticle, the beam current passing through the open areas is projected to the target and the beam current striking the areas adjacent to the open areas is absorbed. In scattering reticles, the subfields are composed of ultra-thin membranes partially covered with heavy metal patterned features. The beam current impinging on the reticle subfields is scattered either through small angles (when passing through the membrane without heavy metal cover) or large angles (when passing through the heavy metal). An aperture in the entrance pupil of the projection system is used as a filter to separate the beam that is scattered through small and large angles, respectively, thereby converting scattering contrast into intensity contrast at the target. The reticle can also be composed of subfields containing features of both the stencil and scattering types, or both in combination, in any or all respective areas or subfields.

In accordance with an illustrative embodiment the invention, a beam shaping aperture 160 is provided at a location where the emitting surface contained in source 105 can be imaged by the condenser lens 115 such that the shaping aperture 160 is uniformly illuminated. The shaping aperture 160 is imaged with the illuminator doublet 120 and 125 to the reticle. The magnification of the doublet is generally about 0.5 (e.g. the shaping aperture is about twice the size of the subfield). The image of the shaping aperture can be deflected (preferably electrostatically) by the shaping plates 170, 175 over a clear area of the reticle 150 as will be described below. Each of the shaping plates 170, 175 comprise one or two pairs of plates to deflect the beam along orthogonal axes, The plates may be flat or arcuate (e.g. circular) in cross-section.

In the preferred implementation of the invention, the emitter surface for the electrons, contained in the source 105, is imaged to the shaping aperture 160, and the first source crossover is imaged using the auxiliary lens 110 to the plane of the condenser lens 115. Other conjugate source crossovers are located at 180 and at the contrast aperture 155 which is located at the front focal plane of the lower lens of the projector doublet 135. As shown, a pair of shaping plates 170, 175 are provided immediately above and below the source crossover 180. The voltages applied to the shaping plates are adjusted in a ratio so that the deflection center coincides with the source crossover 180. This is necessary to prevent motion of the beam at the contrast aperture 155 which would change the intensity of the beam at the wafer plane 140 and would be very difficult to otherwise correct.

In the ideal case of a symmetric embodiment in which the shaping plates are the same size and located symmetrically above and below the source crossover 180, the shaping plates would have the same voltages applied to them. Due to fabrication tolerances, as well as the accuracy in which the position of the source crossover 180 can be positioned, the voltages applied to the shaping plates must be made adjustable. Furthermore, the plates can be mounted on rotational mechanisms so that the electrostatic deflection occurs along the axes defined by the reticle patterns. Additionally, as is common in the practice of electrostatic deflection, the voltage drivers supplying signals to the plates have cross-coupling so that a certain fraction of voltage applied to one axis of a pair of plates can be applied to the other axis of the same pair of plates.

Figure 2:
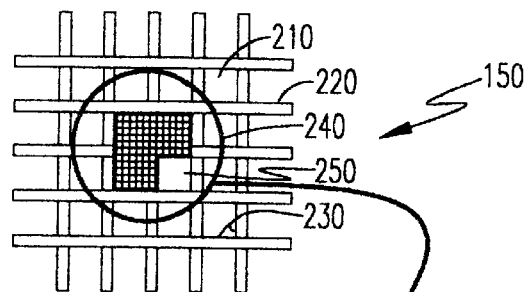
FIG. 2 is a plan view of a portion of a projection reticle in accordance with the invention.

Referring now to FIG. 2, a reticle 150 in accordance with the invention is illustrated in plan view. Regardless of whether the subfields included in the reticle are of the scattering or stencil type or some combination of the two, as alluded to above, the operative portions of the reticle are a very thin membrane of silicon, metal or the like. To increase structural robustness and dimensional stability of the reticle, a one or two-dimensional grid of struts is generally provided integrally with the reticle. A two-dimensional strut pattern is shown in FIG. 2. The reticle fabrication process generally leaves a small margin 230 of unpatterned membrane between the struts and the patterned areas which is referred to as the skirt.

To an extent consistent with the desired functions of the grid discussed above, some portions of some of the struts 220 can be omitted or removed from reticle 150. For example, FIG. 2 illustrates the omission of crossing strut portions in the region indicated by circle 240; essentially enclosing four subfield,areas with remaining strut portions. In accordance with the invention, mask membranes are patterned in some of the subfield areas while at least one subfield area is opened as an aperture of any desired shape or dimensions. Removal of the struts is considered to be desirable to avoid conducting heat into an area in which an aperture potentially as large as a subfield is formed. Since the reticle structure is rendered highly asymmetrical at subfield boundaries adjacent the aperture, thermal distortion is likely to be increased if heat is conducted along struts adjacent the opened subfield.

Figure 3:
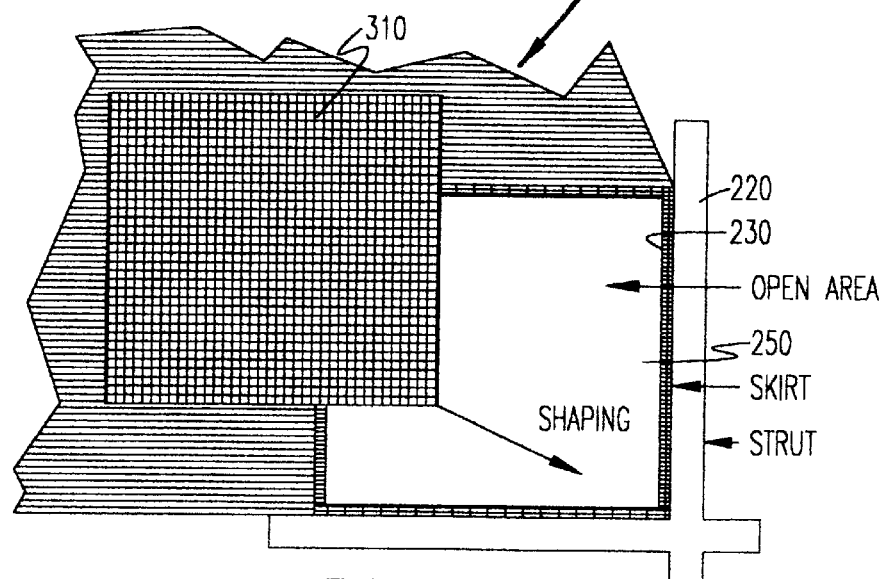
FIG. 3 is a plan view of beam shaping in accordance with the invention.
Figure 4:
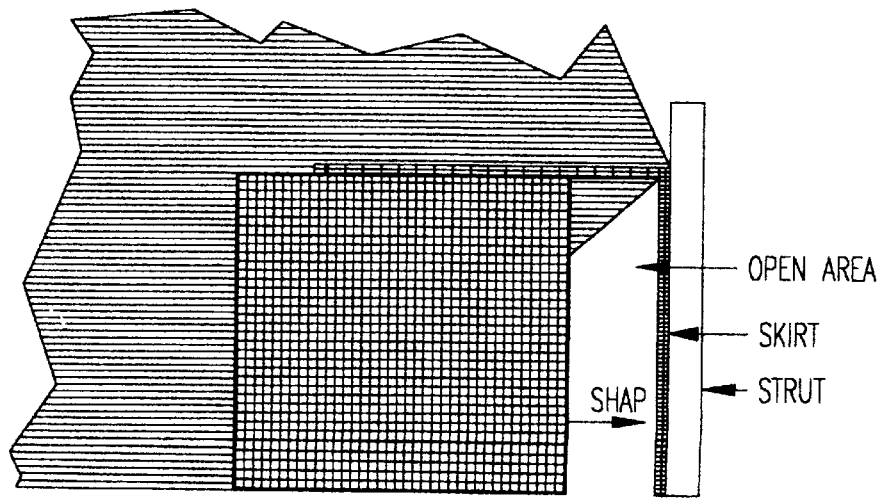
FIG. 4 is a variant form of beam shaping which can be implemented with other forms of beam shaping such as that of FIG. 3 in accordance with the invention.

Since the image of the shaping aperture corresponds to the dimensions of the subfield so that a complete sub-field of the reticle can be simultaneously illuminated in normal operation of the electron beam projection tool, the entire area of the opened subfield can also be illuminated for direct writing at the target. By the same token, the reticle aperture (open area of the reticle) can also be made substantially smaller than the full subfield dimensions and shaped as desired. For example, in FIG. 3, the entire subfield (less the skirt area 230) is illustrated as being opened while a triangular opening is illustrated in FIG. 4.

As alluded to above, the image 310 of the shaping aperture 160 may be deflected (e.g. electrostatically) to overlap any desired portion of the reticle aperture 250 in the opened subfield. As illustrated in FIG. 3, such deflection provides a rectangular compound image, the dimensions and aspect ratio of which can be freely chosen by control of the overlap of the image of the shaping aperture 160 with the reticle aperture 250. Similarly, as illustrated in FIG. 4, a triangular compound image of any desired dimensions can be developed in the same manner. Other reticle aperture 250 features could be used and the two shapes illustrated in FIGS. 3 and 4 should be considered as being exemplary for purposes of illustrating the principles of the invention.

The compound shaped beam thus derived is demagnified and projected onto the target by the projector doublet in the same manner as subfield image patterns derived from the reticle but can be freely deflected below the reticle as desired, essentially allowing the electron beam projection tool to function in much the same manner as a probe-forming tool. The beam which is scattered though the membrane in adjacent (strutless) subfields where the beam may overlap them as the compound image is formed are predominantly stopped by a beam tube (schematically illustrated at 190 of FIG. 1 and usually included in electron beam projection systems) and/or the contrast aperture downstream of the reticle.

This direct writing capability greatly increases the flexibility of operation of the electron beam tool and provides greatly increased economy of operation. If a design is modified, the pattern corresponding to the modification can be directly written without the need for manufacture of a new reticle while maintaining the high throughput advantages of electron beam projection tools for all unmodified subfields so long as an apertured subfield 250 is available somewhere on the reticle. Even if such an apertured subfield is not originally provided on the reticle, an aperture can be provided by the simple expedient of removing a modified subfield or portion thereof. Whether or not the design has been modified, the variable beam shaping provided by the invention allows high-resolution pattern features to be written by stitching together the variable shapes that can be derived.

Additionally, it should be appreciated that further advantages are provided by the invention which extend the fidelity of the pattern which can be developed at the target or wafer. Specifically, since the compound image has uniform density, no local Coulomb effect occurs.

Figure 5A:
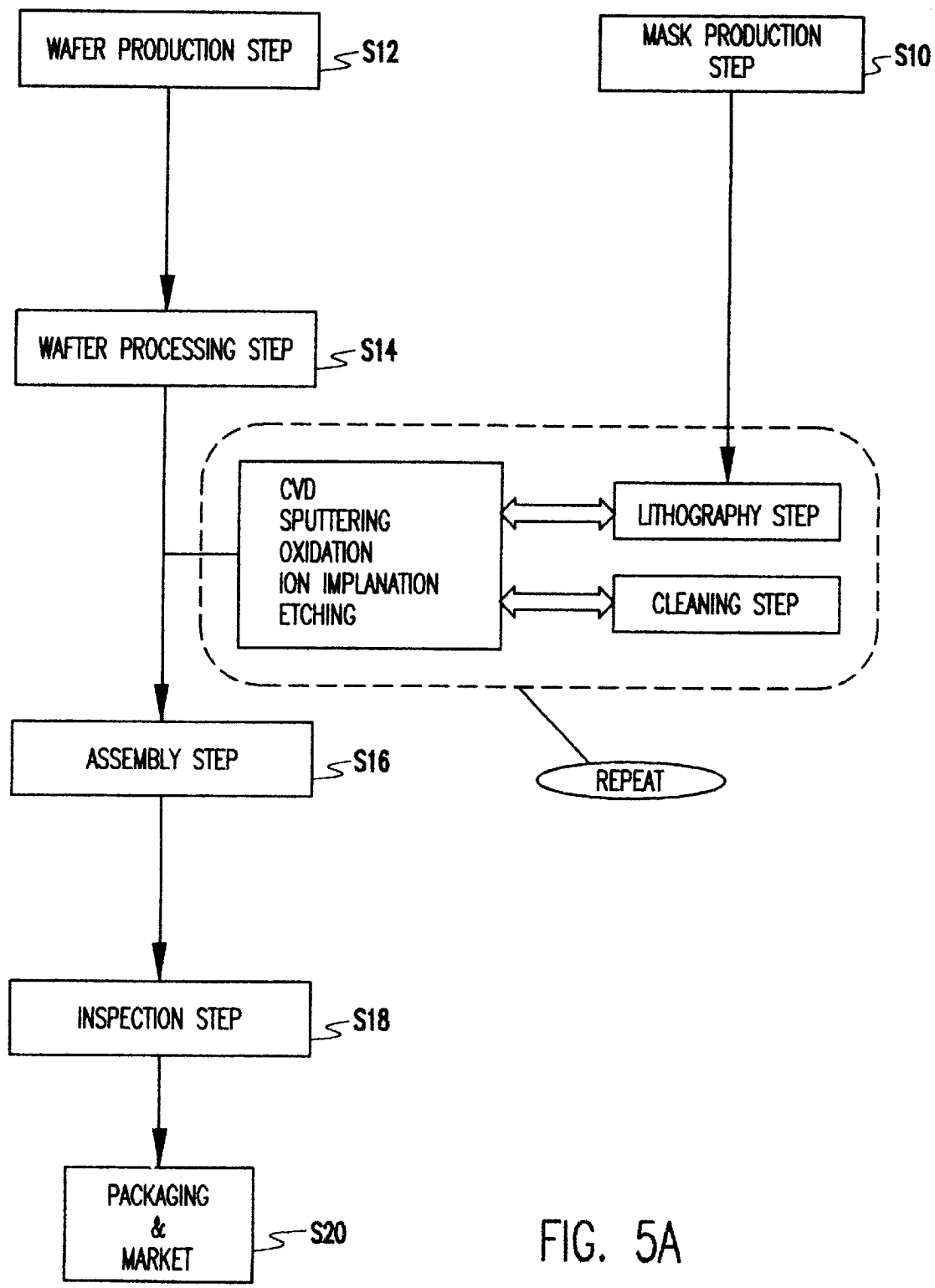
FIGS. 5A and 5B illustrate a generalized method of fabricating an integrated circuit device utilizing the invention.

FIG. 5A shows a generalized flow diagram providing an overview of the fabrication process for a semiconductor device (or apparatus) utilizing the invention. It will be understood by one of ordinary skill in the art that FIG. 5A may equally represent a high level block diagram of a fabrication process of a semiconductor device. It is also well understood that the high level block diagram represents a preferred although generalized fabrication method and that other fabrication methods may be equally used with the present invention. Details of particular fabrication methods are unimportant to the practice of the invention; however, at least one lithographic exposure is invariably required to determine device locations and dimensions. When the lithographic process is carried out in accordance with the invention described above, accurately defined shaped patterns can be achieved consistent with high throughput in manufacture of integrated circuits of increased functionality and improved performance, which are not otherwise produceable with other currently known lithographic techniques that do not include utilization of the invention.

Referring now to FIG. 5A, the semiconductor device fabrication begins with a mask fabrication at step S10. The mask fabrication comprises patterning a mask by known methods such as, for example, resist coating, electron beam exposure, development, etching, resist stripping and the like.

Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification to the thin film may be performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art, that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the intended use of the finished device.

The thin film is patterned using the mask fabricated in step S10. The patterning of the thin film includes exposing the resist layer, via a lithographic process (e.g., charged particle exposure corresponding to the mask and/or compound images of a clear area of the mask and a shaping aperture), to form a latent image on the resist. The charged particle exposure is discussed in detail with reference to FIG. 5B. It is further well understood that the charged particle exposure selectively modifies the resist in a predetermined pattern by altering the chemical composition of the resist. The resist is then developed to form a pattern in accordance with the exposure and inspected for any defects.

After inspection, the wafer is baked to stabilize the resist pattern, and after the desired processing (e.g., etching, deposition, implantation and the like), the resist may be stripped and the wafer washed, if necessary. The charged particle exposure associated with step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact hole (e.g., through hole) to provide electrical connections to the devices thus formed.

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 5B:
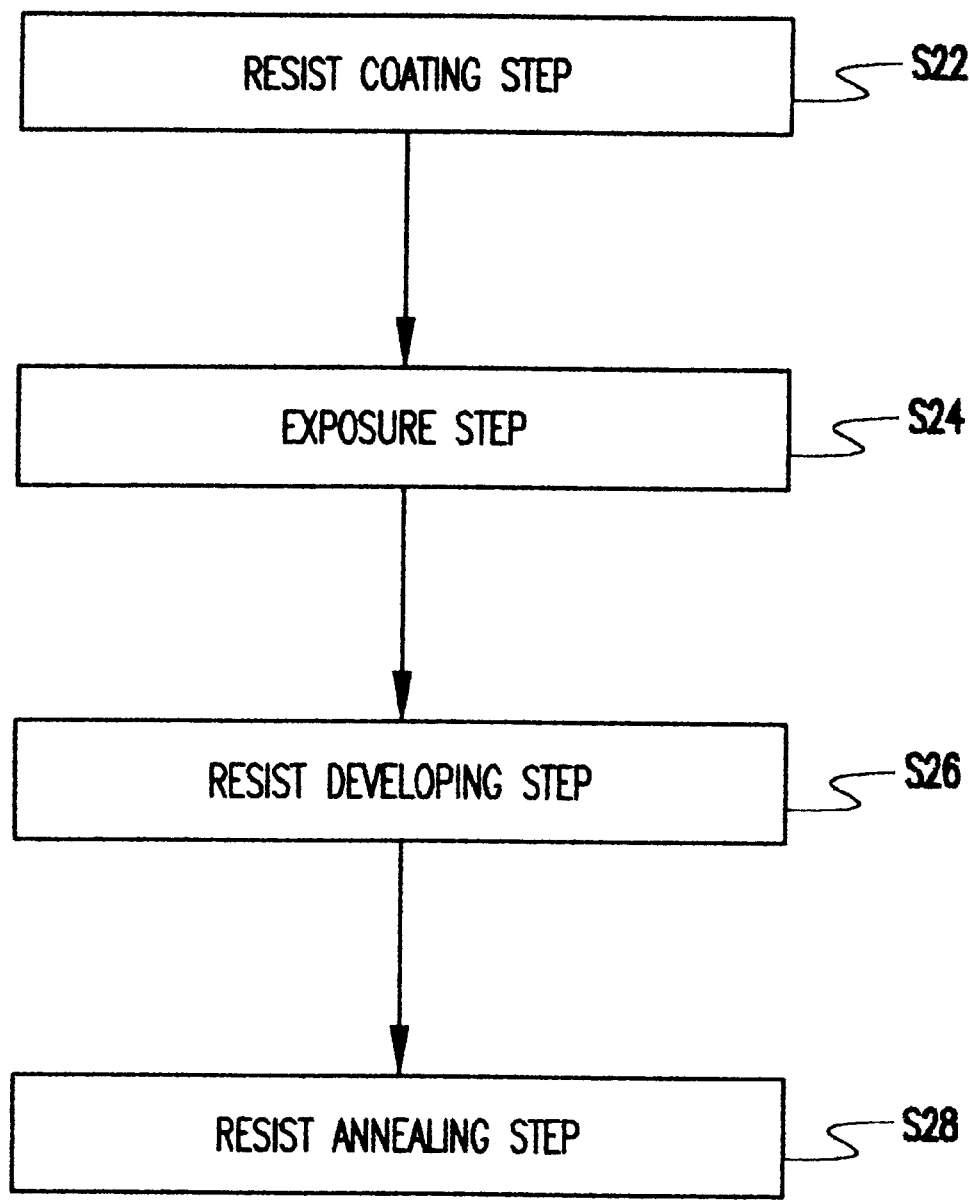

FIG. 5B shows the detailed process of resist pattern formation as shown with relation to the resist pattern formation of step S14 of FIG. 5A. As is well understood by those of ordinary skill in the art, the lithographic process of steps S22–S26 is invariably included to define latent images on the resist, and that the patterning of the resist is critical to the overall design of the device regardless of the technology that may be used to develop such latent images on the resist since the location and basic dimensions of electron elements and conductors are established thereby. To this end, at step S22, the step of resist coating is shown. At step S24, the resist is exposed to electron means utilizing the mask formed in step S10 of FIG. 5A. This exposure is performed, for example, by an electron beam stepper device. Additionally, the invention provides for the exposure of compound images of variable shapes at high throughput, resolution and accuracy while avoiding a need to provide the entire circuit pattern in the subfields of the reticle or mask. At step S26, the resist is developed to form a pattern in accordance with the exposure of step S24. At step S26, the resist is then annealed. Once such a pattern is formed, the semiconductor fabrication process continues as described above.

In view of the foregoing, it is seen that the invention overcomes serious and persistent problems which have previously existed in electron beam projection tools and provides substantially an additional regime of enhanced resolution for critical regions of a semiconductor integrated circuit or other critical lithographic applications. These advantages are achieved at a very small economic cost of direct writing of a relatively small number of subfields, only as needed, and which is minimal relative to the cost of manufacture of reticles incorporating design changes while providing enhanced resolution in any location which may be critical.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A charged particle beam projection lithography tool comprising
   a shaping aperture,
   a patterned reticle having an clear area, and
   means for imaging said shaping aperture at a portion of said clear area of said reticle, said means for imaging including means for deflecting a charged particle beam shaped by said shaping aperture and having a deflection center at a location of a source crossover of said charged particle beam projection lithography tool,
   wherein said means for deflecting said charged particle beam includes a pair of deflectors above and below a source crossover, respectively, said pair of deflectors being energized such that a deflection center is located coincident with a location of a source crossover.

2. A charged particle beam projection lithography tool as recited in claim 1, wherein image of said shaping aperture corresponds in size to said clear area of said reticle.

3. A charged particle beam projection lithography tool as recited in claim 1, wherein said means for deflecting said charged particle beam includes a pair of electrostatic deflection plates.

4. A charged particle beam projection lithography tool as recited in claim 1, wherein image of said shaping aperture corresponds in size to a subfield of said reticle.

5. A charged particle beam project on lithography tool as recited in claim 1, wherein said source crossover is conjugate to a contrast aperture with respect to a lens of said charged particle beam projection lithography tool.

6. A charged particle beam projection lithography tool as recited in claim 1, wherein said reticle is of the stencil type.

7. A charged particle beam projection lithography tool as recited in claim 1, wherein said reticle is of the scattering type.

8. A method of charged particle beam projection lithography including steps of projecting a pattern formed in a patterned area of a reticle to a target, imaging a shaping aperture onto a portion of a clear area of said reticle to produce a compound image at said target, said imaging step including deflecting said image of said shaping aperture with a pair of deflectors above and below a deflection center and energized such that a deflection center is located coincident with a location of a source crossover.

9. A method as recited in claim 8, wherein said compound image of said shaping aperture and clear area of said reticle is rectangular.

10. A method as recited in claim 8, wherein said compound image of said shaping aperture and clear area of said reticle is triangular.

11. A method as recited in claim 8, including a further step of translating said reticle in a plane.

12. A method as recited in claim 8, including the further step of collecting charged particles scattered from portions of said reticle adjacent said clear area.

13. A method as recited in claim 12, wherein said collecting step is performed by at least one of a beam tube and a contrast aperture.

14. A method of fabricating a semiconductor device including steps of projecting a pattern formed in a patterned area of a reticle to a wafer, imaging a shaping aperture onto a portion of a clear area of said reticle to produce a compound image at said wafer to expose a resist thereon, deflecting said image of said shaping aperture with a pair of deflectors above and below a deflection center and energized such that a deflection center is located coincident with a location of a source crossover, and processing said wafer in accordance with a pattern of said resist corresponding to a portion of an image of said shaping aperture.

15. A method as recited in claim 14, wherein said compound image of said shaping aperture and clear area of said reticle is rectangular.

16. A method as recited in claim 14, wherein said compound image of said shaping aperture and clear area of said reticle is triangular.

17. A method as recited in claim 14, including a further step of translating said reticle in a plane.

18. A method as recited in claim 14, including the further step of collecting charged particles scattered from portions of said reticle adjacent said clear area.

19. A method as recited in claim 18, wherein said collecting step is performed by at least one of a beam tube and a contrast aperture.

* * * * *